US007589451B2

(12) United States Patent
Morita et al.

(10) Patent No.: US 7,589,451 B2
(45) Date of Patent: Sep. 15, 2009

(54) SURFACE ACOUSTIC WAVE DEVICE

(75) Inventors: Takao Morita, Kouza-gun (JP); Takuya Ohwaki, Kouza-gun (JP)

(73) Assignee: Epson Toyocom Corporation, Tokyo (JP)

( * ) Notice: Subject to any disclaimer, the term of this patent is extended or adjusted under 35 U.S.C. 154(b) by 282 days.

(21) Appl. No.: 10/594,982

(22) PCT Filed: Mar. 8, 2005

(86) PCT No.: PCT/JP2005/003998

§ 371 (c)(1),
(2), (4) Date: Sep. 29, 2006

(87) PCT Pub. No.: WO2005/099089

PCT Pub. Date: Oct. 20, 2005

(65) Prior Publication Data

US 2007/0194657 A1   Aug. 23, 2007

(30) Foreign Application Priority Data

Apr. 1, 2004 (JP) ............................. 2004-108608
Oct. 26, 2004 (JP) ............................. 2004-310452

(51) Int. Cl.
*H03H 9/125* (2006.01)
*H03H 9/25* (2006.01)
(52) U.S. Cl. .................................. 310/313 R; 333/195
(58) Field of Classification Search ................ 310/313; 333/187–195
See application file for complete search history.

(56) References Cited

U.S. PATENT DOCUMENTS

RE35,204 E * 4/1996 Lewis ..................... 310/313 A (Continued)

FOREIGN PATENT DOCUMENTS

JP    55-45284    3/1980

(Continued)

OTHER PUBLICATIONS

Merion Lewis, "Surface Skimming Bulk Wave", SSBW IEEE Ultrasonics Symp. Proc. (1977).

*Primary Examiner*—Jaydi SanMartin
(74) *Attorney, Agent, or Firm*—William L. Androlia; H. Henry Koda

(57) ABSTRACT

An object of the invention is to provide a SAW device where a device size is made smaller than that of a conventional structure, has a high Q value, and is excellent in a frequency temperature characteristic in a SAW device using a quartz substrate. Therefore, IDTs 2 including pluralities of electrode fingers mutually inserted and grating reflectors 3a and 3b positioned on both sides of the IDTs 2 are disposed on a piezoelectric substrate 1. The piezoelectric substrate 1 is a quartz flat plate where a cut angle θ of a rotation Y cut quartz substrate is set to satisfy a range of −64.0°<θ<−49.3° in a counterclockwise direction from a crystal Z-axis and a propagation direction of a surface acoustic wave is set to 90°±5° to a crystal X-axis, and a surface acoustic wave to be excited is an SH wave. The IDTs 2 and the grating reflectors 3a and 3b are made from Al or alloy including Al as a main component, and when a wavelength of a surface acoustic wave is represented as λ, an electrode film thickness H/λ standardized by the wavelength is set to satisfy 0.04<H/λ<0.12.

16 Claims, 12 Drawing Sheets

(a)

(b)

U.S. PATENT DOCUMENTS

| | | | |
|---|---|---|---|
| 5,986,523 A * | 11/1999 | Morozumi et al. | 333/194 |
| 6,346,864 B1 * | 2/2002 | Kadota | 333/133 |
| 6,369,491 B1 * | 4/2002 | Nakagawa et al. | 310/364 |
| 6,369,667 B1 * | 4/2002 | Kadota et al. | 333/133 |
| 6,710,509 B1 * | 3/2004 | Kadota | 310/313 A |
| 6,946,930 B2 * | 9/2005 | Kadota et al. | 333/195 |
| 6,972,508 B2 * | 12/2005 | Kandou et al. | 310/313 A |
| 2002/0038985 A1 * | 4/2002 | Iwamoto | 310/313 R |
| 2002/0060618 A1 * | 5/2002 | Nakao et al. | 333/193 |
| 2002/0074899 A1 * | 6/2002 | Nakao et al. | 310/313 R |
| 2005/0122188 A1 * | 6/2005 | Funasaka et al. | 333/193 |

FOREIGN PATENT DOCUMENTS

| | | |
|---|---|---|
| JP | 58-33309 | 2/1983 |
| JP | 58-033309 | 2/1983 |
| JP | 62-16050 | 4/1987 |
| JP | 1-34411 | 7/1989 |
| JP | 51-34411 | 7/1989 |
| JP | 7-046079 | 2/1995 |
| JP | 7-55680 | 3/1995 |
| JP | 7-198428 | 8/1995 |
| JP | 9-275323 | 10/1997 |
| JP | 2000-151355 | 5/2000 |
| JP | 2000-323955 | 11/2000 |
| JP | 2001-068959 | 3/2001 |
| JP | 2002-330051 | 11/2002 |
| JP | 2003-204245 | 7/2003 |
| JP | 2004-007846 | 1/2004 |
| JP | 2004-023254 | 1/2004 |
| JP | 2004-328387 | 11/2004 |

* cited by examiner

[Fig.1]
(a)
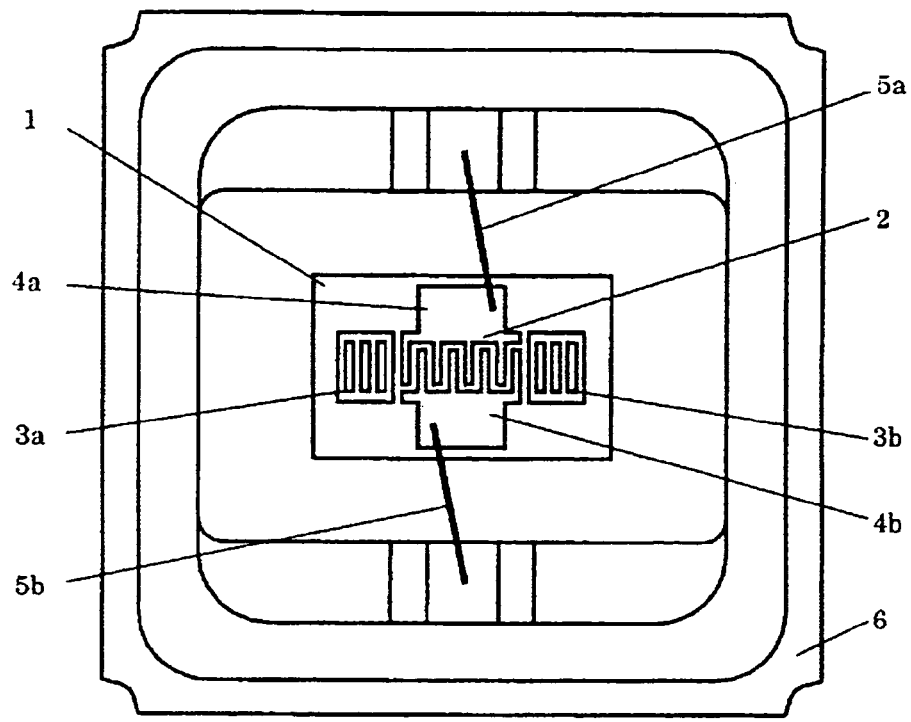
(b)
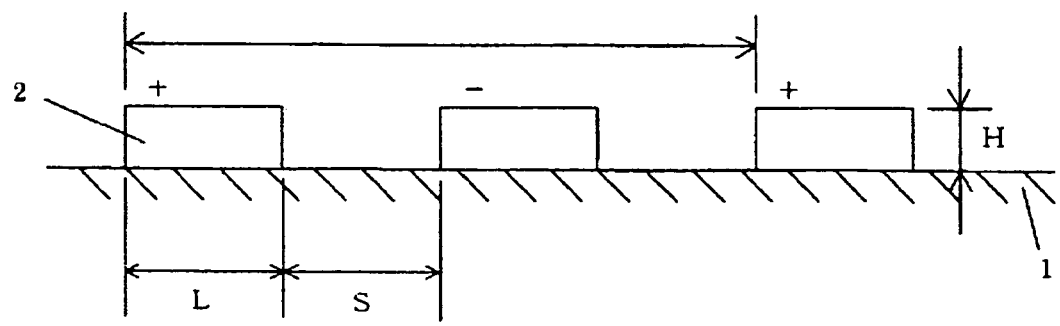

[Fig.2]
(a)
|  | Product of present invention | Conventional product (ST cut quartz) | Unit |
|---|---|---|---|
| Q value | 27500 | 15000 | — |
| Figure of merit | 21.2 | 10.7 | — |
| Secondary temperature coefficient | −0.020 | −0.034 | ppm/°C$^2$ |
(b)
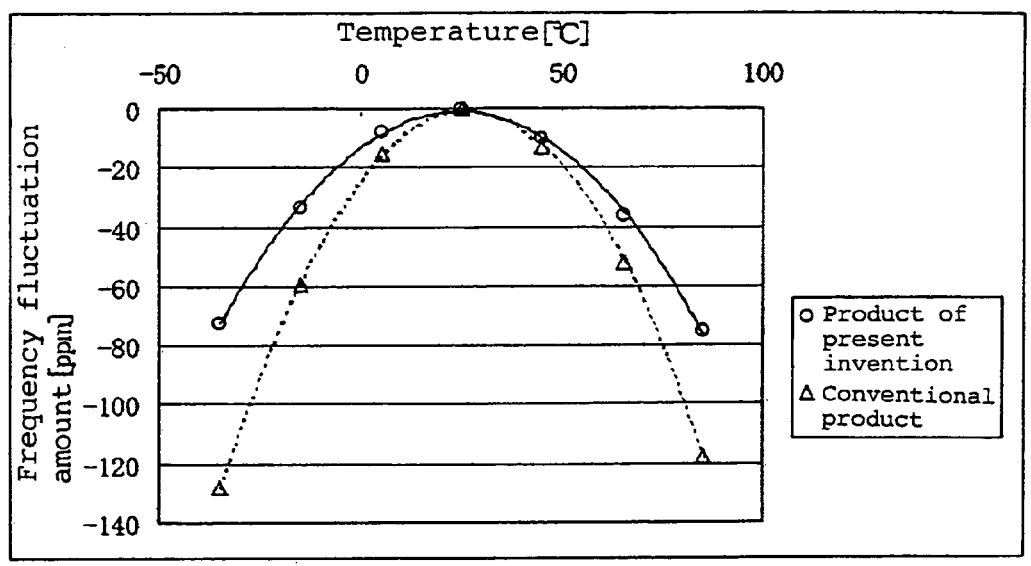

[Fig.3]
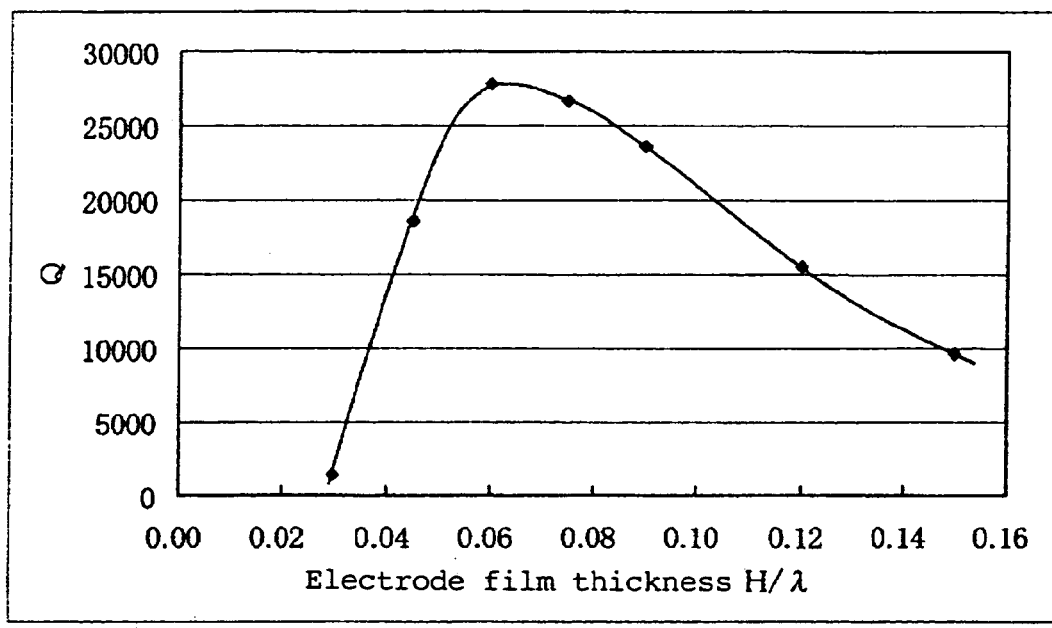
[Fig.4]
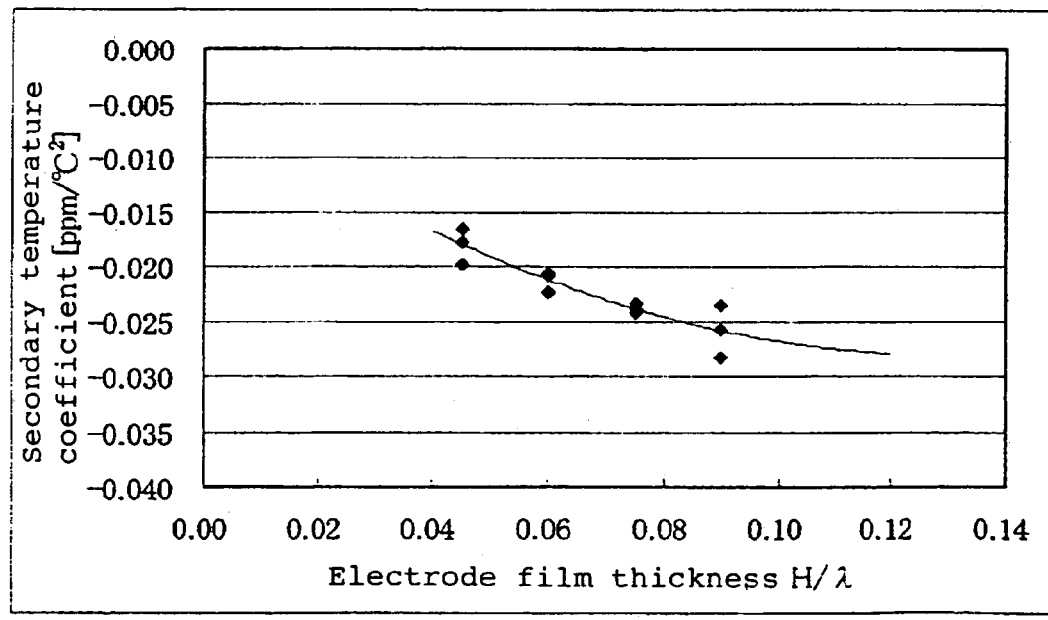

[Fig.5]
(a)
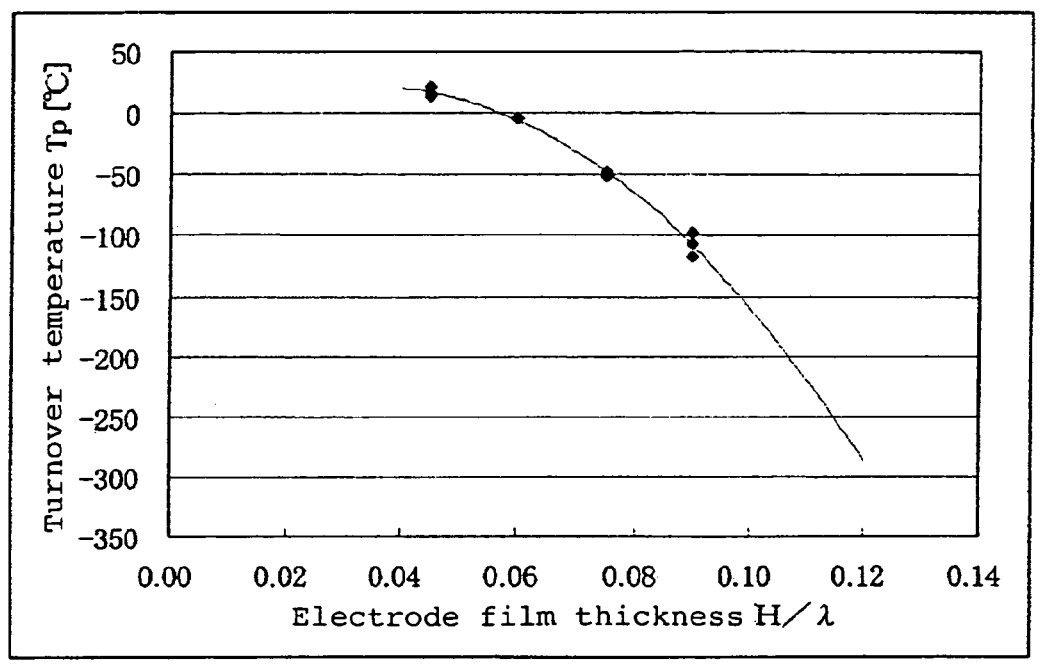
(b)
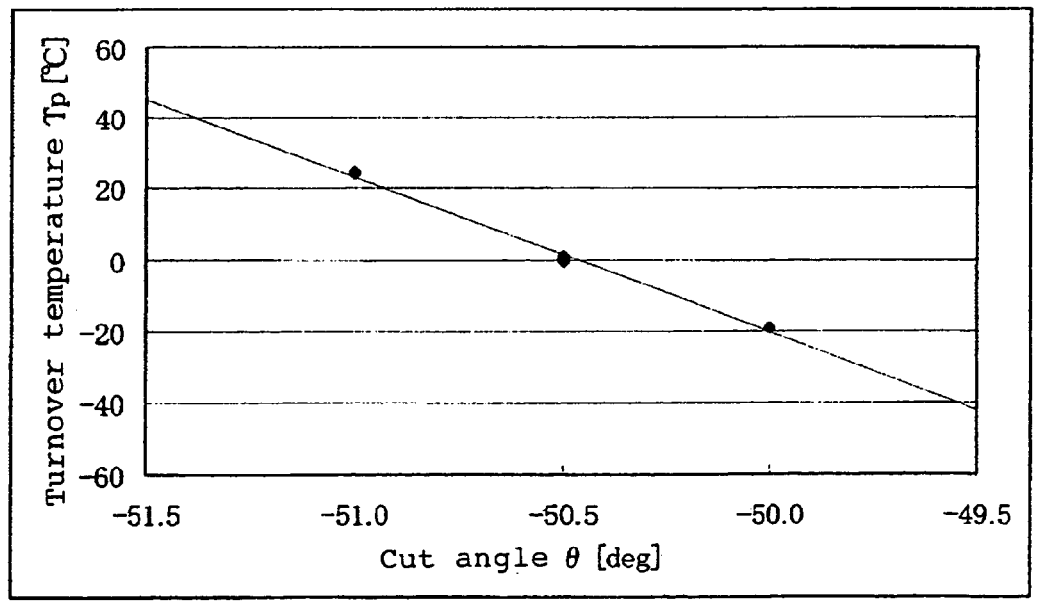

[Fig.6]
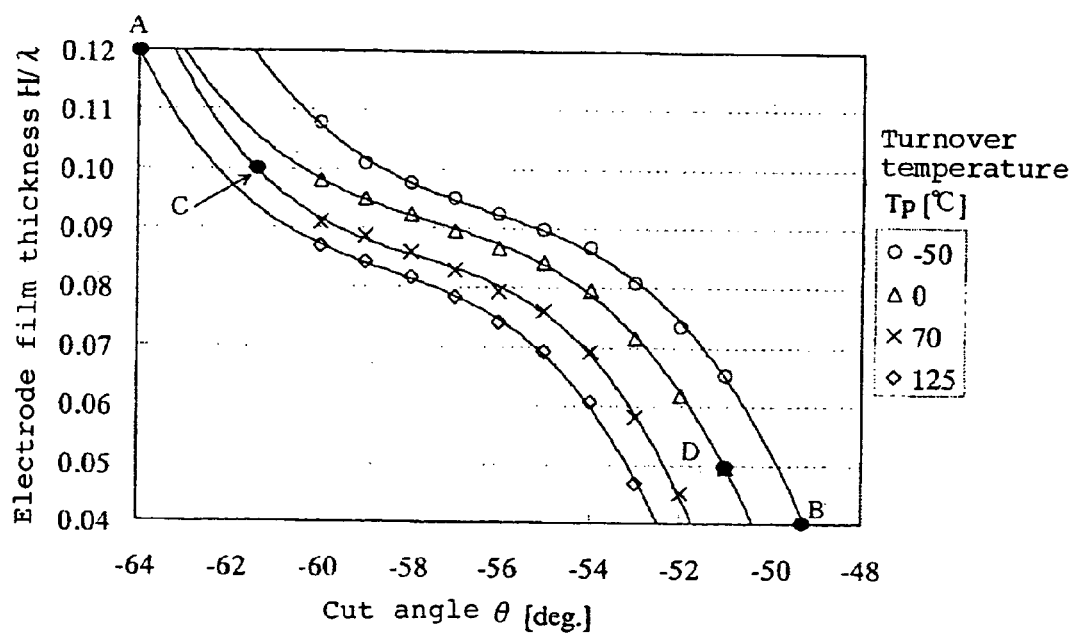
[Fig.7]
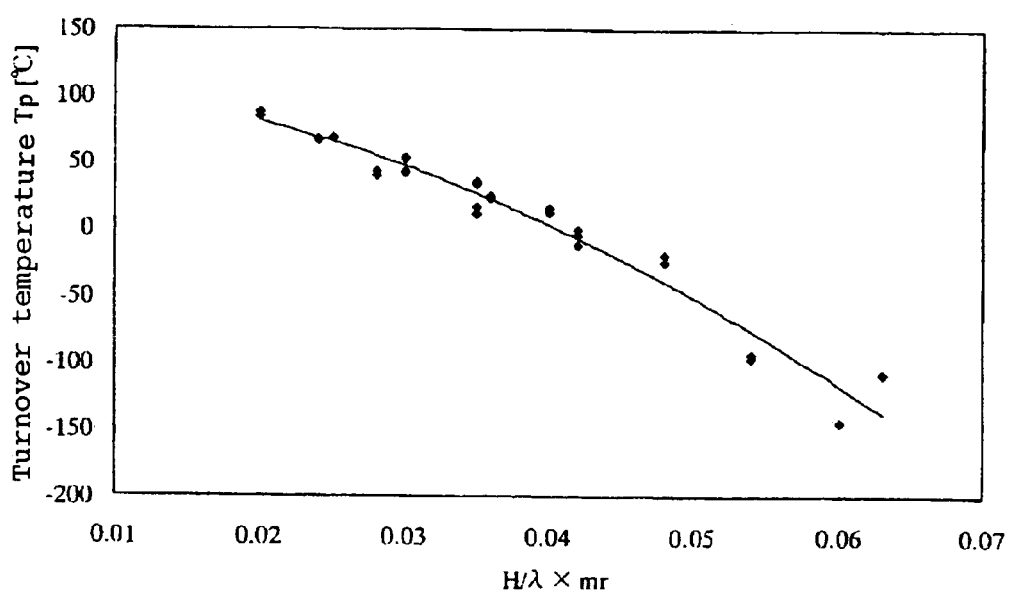

[Fig.8]
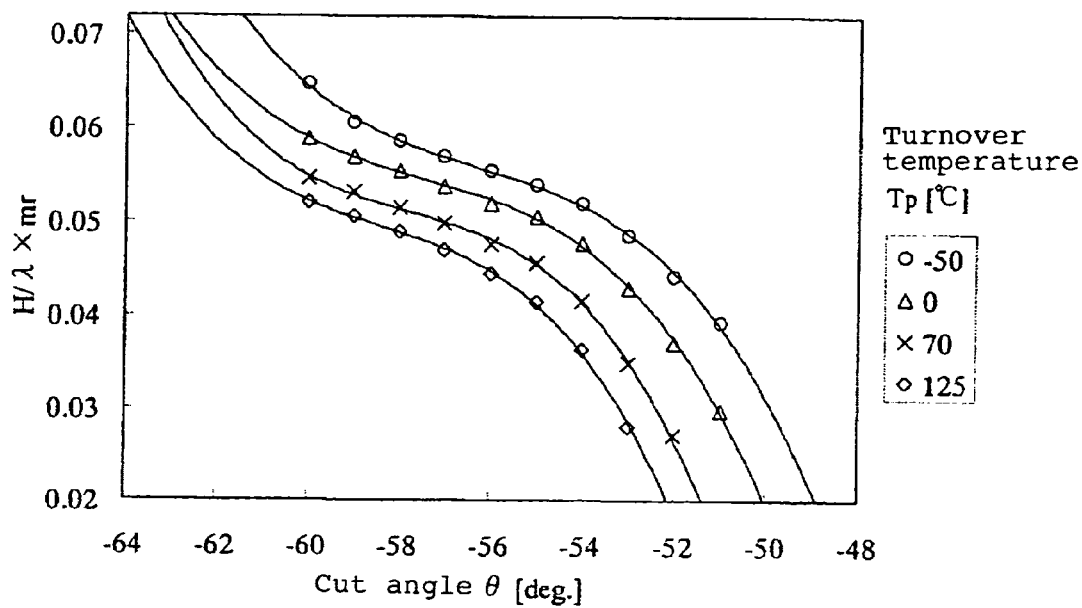
[Fig.9]
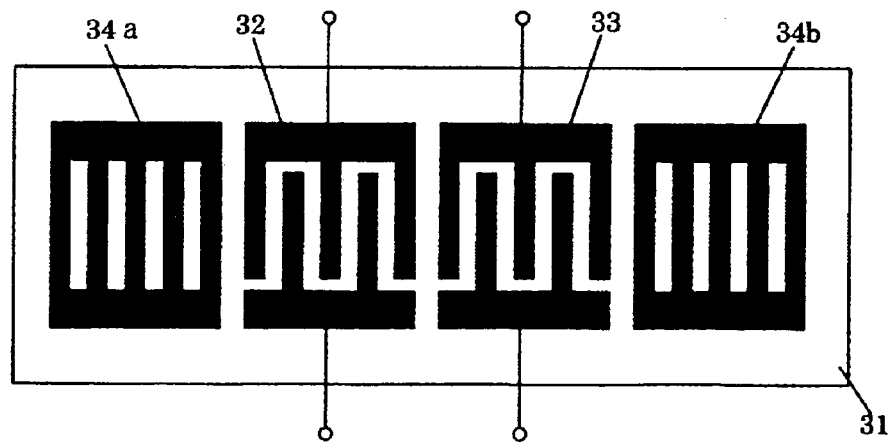

[Fig.10]
(a)
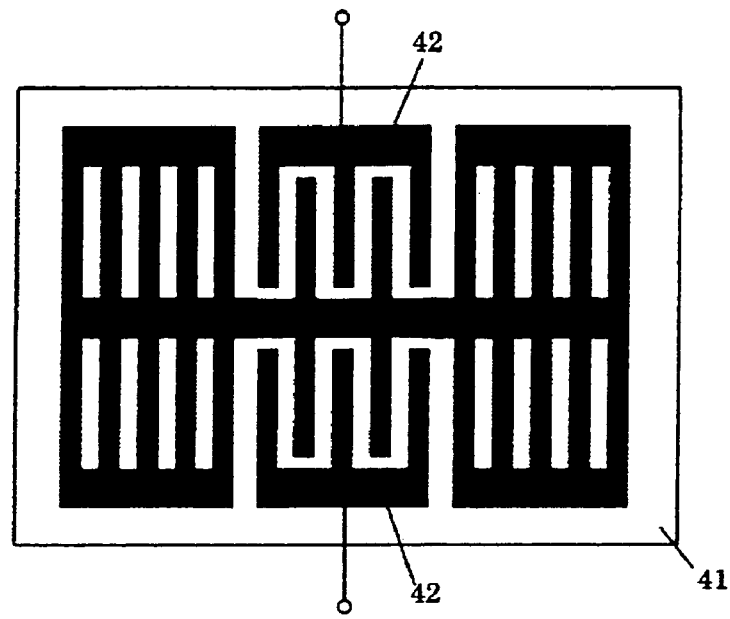
(b)
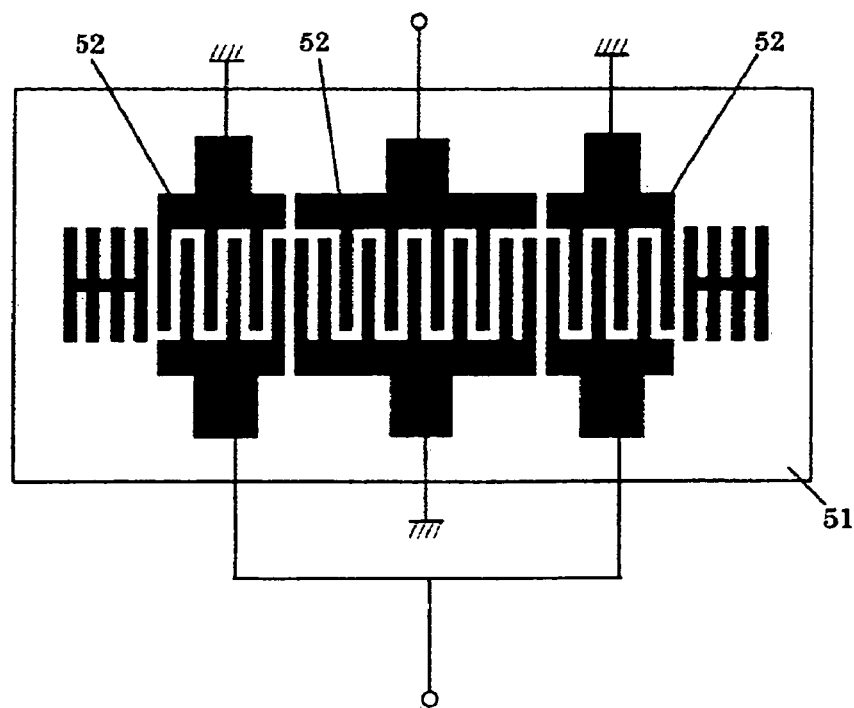

[Fig.11]
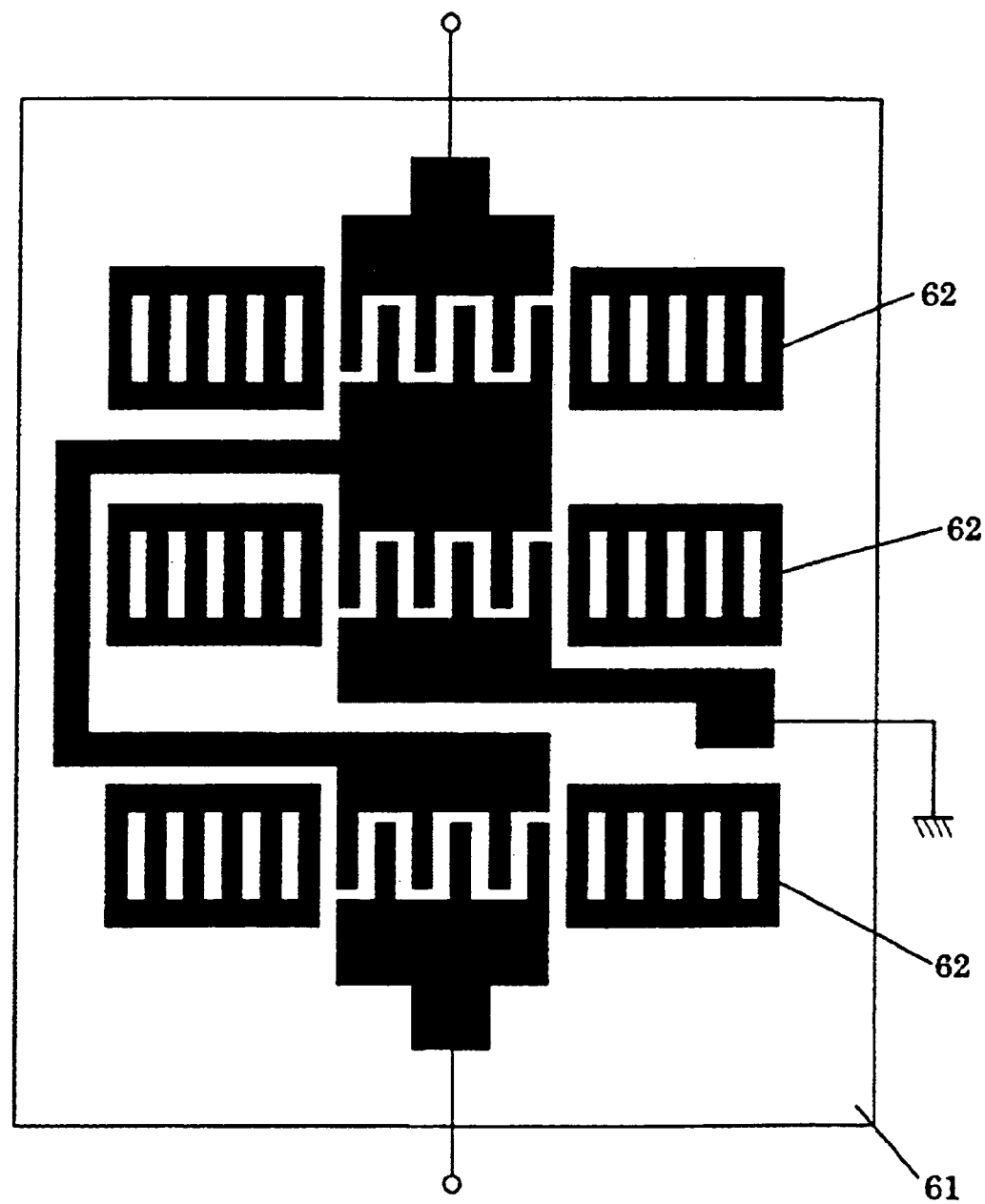

[Fig.12]
(a)
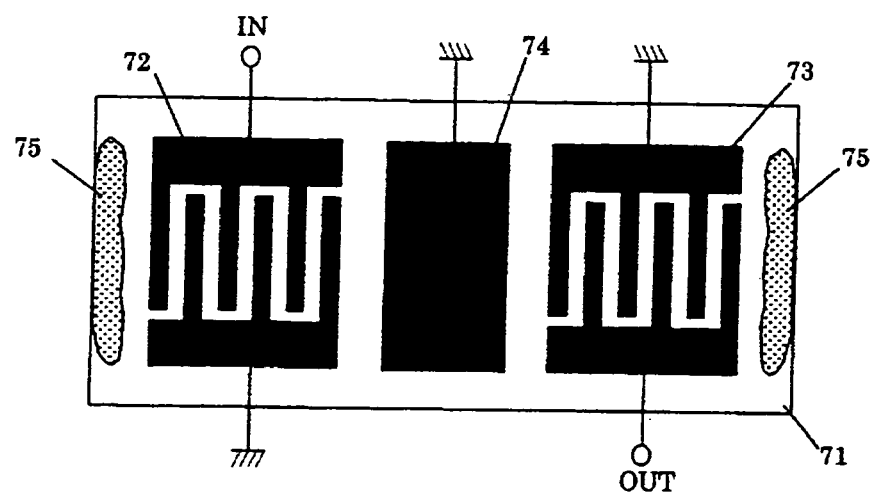
(b)
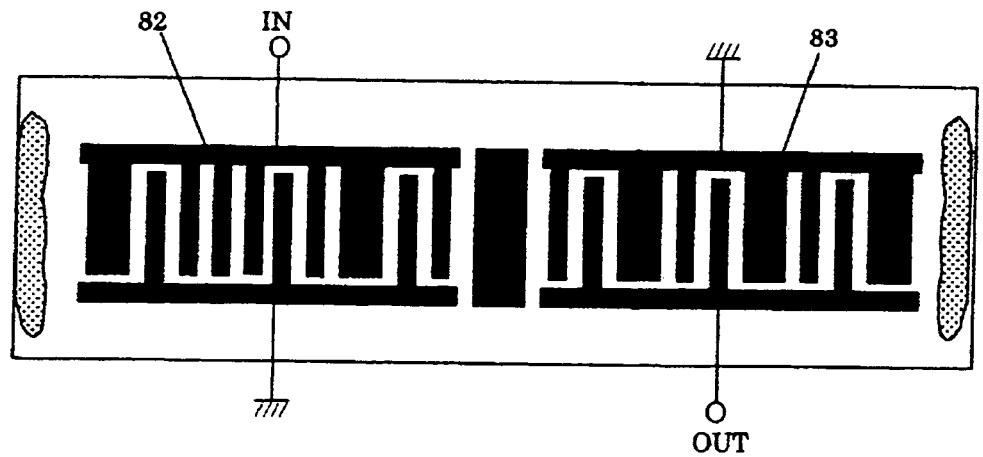

[Fig.13]
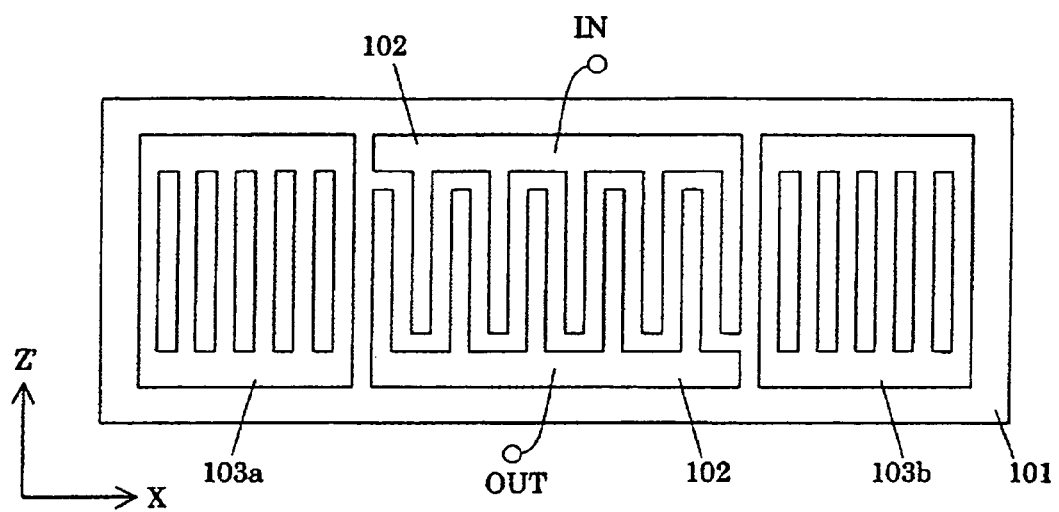

[Fig.14]
(a)
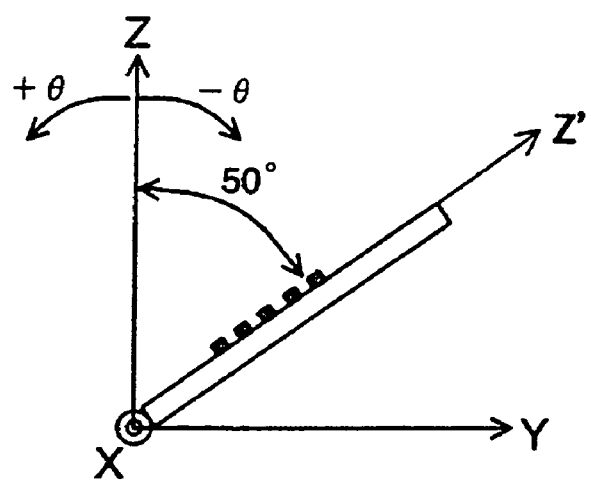
(b)
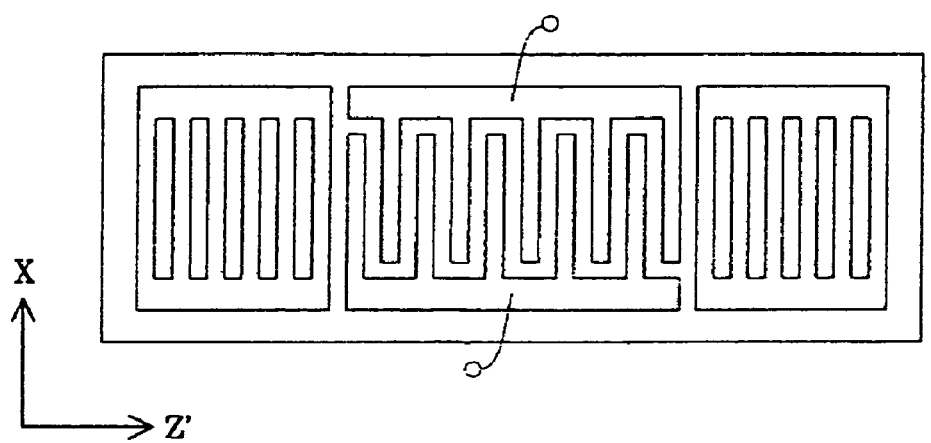

[Fig.15]
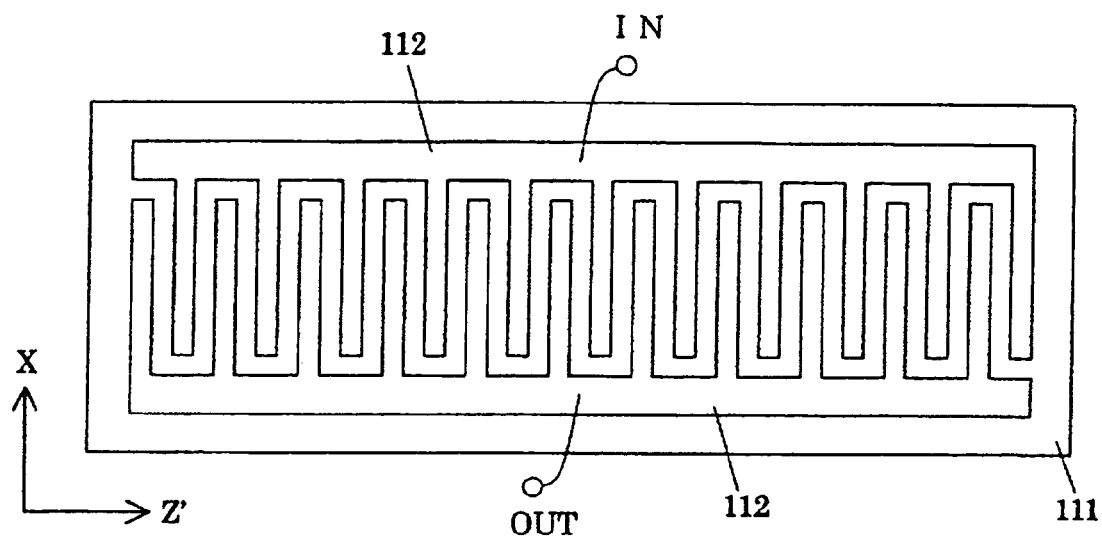

SURFACE ACOUSTIC WAVE DEVICE

TECHNICAL FIELD

The present invention relates to a surface acoustic wave device using a quartz substrate in which a device size is reduced, a Q value is increased, and a frequency-temperature characteristic is improved.

BACKGROUND ART

In recent years, a surface acoustic wave (hereinafter, SAW) device is widely utilized as apart for a terminal for mobile communication, a vehicle-mounted equipment, or the like, and it is strongly demanded to be downsized, have a high Q value, and be excellent in frequency stability.

As a SAW device realizing these demands, there is a SAW device using an ST cut quartz substrate. The ST cut quartz substrate is a cut name of a quartz plate having a plane (XZ' plane) obtained by rotating an XZ plane from a crystal Z-axis in a counterclockwise direction by an angle of 42.75° utilizing a crystal X-axis as a rotation axis, and it utilizes a SAW (hereinafter, called ST cut quartz SAW) that is a (P+SV) wave propagated in a crystal X direction, called "Rayleigh wave". An application of the ST cut quartz SAW device widely lies in a SAW resonator used as an oscillator, a filter for IF disposed between an RF stage and an IC in a mobile communication terminal, or the like.

The reason why the ST cut quartz SAW device allows realization of a downsized device with a high Q value includes a point such that reflection of SAW can be utilized efficiently. An ST cut quartz SAW resonator shown in FIG. 13 will be explained as one example. The ST cut quartz SAW resonator has a structure that interdigital electrodes (hereinafter, called IDT) 102 having pluralities of electrode fingers mutually inserted are disposed on an ST cut quartz substrate 101 and grating reflectors 103a and 103b for reflecting SAW are disposed on both sides of the IDTs 102. Since the ST cut quartz SAW is a wave propagated along a surface of a piezoelectric substrate, it is efficiently reflected by the grating reflectors 103a and 103b and SAW energy can be sufficiently confined in the IDTs 102, so that a downsized device with a high Q value can be obtained.

As an important factor in use of the SAW device, there is a frequency-temperature characteristic. In the ST cut quartz SAW, it is generally known that the primary temperature coefficient of the frequency-temperature characteristic of the SAW is zero, a characteristic thereof is expressed by a quadratic curve, and the SAW is excellent in frequency stability because a frequency fluctuation amount is significantly reduced by making an adjustment so that a turnover temperature is positioned at the center in a usage temperature range.

However, in the ST cut quartz SAW device, while the primary temperature coefficient is zero, the secondary temperature coefficient is relatively large such as −0.034 (ppm/° $C.^2$). Accordingly, when the usage temperature range is expanded, the frequency fluctuation amount becomes extremely large.

As an approach for solving the problem, there is a SAW device disclosed in Meirion Lewis, "Surface Skimming Bulk Wave, SSBW", IEEE Ultrasonics Symp. Proc., pp. 744 to 752 (1977), and Japanese Examined Patent Publication No. 62-016050. As shown in FIG. 14, the feature of the SAW device is characterized in that a cut angle θ of a rotation Y cut quartz substrate is set near a position rotated from a crystal Z-axis in a counterclockwise direction by an angle of −50°, and a propagation direction of SAW is set to a perpendicular direction (a Z'-axis direction) to a crystal X-axis. Incidentally, when the cut angle is expressed by Euler angle, (0°, θ+90°, 90°)=(0°, 40°, 90°) is obtained. The SAW device is characterized in that an SH wave propagated just below a surface of a piezoelectric substrate is exited by an IDT and oscillation energy is confined just below an electrode. A frequency-temperature characteristic of the SAW device forms a cubic curve, and since a frequency fluctuation amount in a usage temperature range is significantly reduced, an excellent frequency-temperature characteristic is obtained.

However, since the SH wave is a wave that fundamentally submerges in a substrate to advance, a reflecting efficiency of a SAW obtained by a grating reflector is poorer than that in the ST cut quartz SAW propagated along the piezoelectric substrate surface. Accordingly, there is a problem that it is difficult to realize a downsized SAW device with high Q. Since the prior Publication includes disclosure about application as a delay line which does not utilize reflection of a SAW but it does not propose any means for utilizing reflection of a SAW, it is said to be difficult to put the SAW device in a practical use.

In order to solve the problem, Japanese Examined Patent Publication No. 01-034411 discloses a so-called multi-pair IDT type SAW resonator in which, as shown in FIG. 15, a cut angle θ of a rotation Y cut quartz substrate is set in the vicinity of −50° and multiple pairs, such as 800±200 pairs, of IDTs 112 is formed on a piezoelectric substrate 111 where a propagation direction of a SAW is set in a perpendicular direction (the Z'-axis direction) to a crystal X-axis, so that high Q is achieved by confining SAW energy by only reflection of the IDTs 112 themselves without utilizing a grating reflector.

However, the multi-pair IDT type SAW resonator cannot obtain efficient energy confining effect as compared with a SAW resonator including a grating reflector. Since the number of IDT pairs required to obtain a high Q value is increased considerably to 800±200 pairs, there is a problem that a device size becomes larger than an ST cut quartz SAW resonator, so that a recent demand for size reduction cannot be satisfied.

In the SAW resonator disclosed in Japanese Examined Patent Publication No. 01-034411, when a wavelength of a SAW excited by the IDT is represented as λ, a Q value can be increased by setting an electrode film thickness to 2% λ or more, preferably 4% λ or less. However, when a resonant frequency is 200 MHz, the Q value reaches saturation near 4% λ, but the Q value obtained at that time becomes only about 20000 and only the Q value approximately equal to that in the ST cut quartz SAW resonator can be obtained in a comparison with the ST cut quartz SAW resonator. As its reason, it is thought that since, when the film thickness is in a range of 2% λ or more to 4% λ or less, a SAW are not concentrated sufficiently on a piezoelectric substrate surface, reflection cannot be utilized efficiently.

| [Patent Document 1] | Japanese Examined Patent Publication No. 62-016050 |
|---|---|
| [Patent Document 2] | Japanese Examined Patent Publication No. 01-034411 |
| [Nonpatent Document 1] | Meirion Lewis, "Surface Skimming Bulk Wave, SSBW", IEEE Ultrasonics Symp. Proc., pp. 744 to 752 (1977) |

DISCLOSURE OF THE INVENTION

Problems to be Solving by this Invention

A problem to be solved is that, when an ST cut quartz substrate is used as a piezoelectric substrate, the secondary temperature coefficient of a frequency-temperature characteristic is large as −0.034 (ppm/° C.$^2$) so that a frequency fluctuation amount becomes considerably large practically. The structure of the SAW device disclosed in Japanese Examined Patent Publication No. 01-034411 includes a point that, since the number of pairs of IDTs has to be made considerably large, a device is increased in size.

Means for Solving the Problems

In order to solve the problem, the invention according to claim 1 of the present invention provides a SAW device comprising a piezoelectric substrate and an IDT that is formed on the piezoelectric substrate and is made from Al or alloy including Al as a main component, an excited wave being an SH wave, characterized in that the piezoelectric substrate is a rotation Y cut substrate made from a quartz flat substrate, where a cut angle θ of said piezoelectric substrate is a rotation angle of a crystal Z-axis when the piezoelectric substrate is rotated around a crystal X-axis, a direction in which the piezoelectric substrate is rotated from a positive Z-axis side to a positive Y-axis side is a direction in which said cut angle θ is minus, and the cut angle θ is set in a range of −64.0°<θ<−49.3°, and a propagation direction of a SAW is set to (90°±5°) to a crystal X-axis, and when a wavelength of the SAW to be excited is represented as λ, an electrode film thickness H/λ standardized by a wavelength of the IDT is set to satisfy 0.04<H/λ<0.12.

The invention according to claim 2 provides the SAW device, characterized in that a relationship between the cut angle θ and the electrode film thickness H/λ satisfies $$-1.34082\times10^{-4}\times\theta^3-2.34969\times10^{-2}\times\theta^2-1.37506\times\theta-\\26.7895<H/\lambda<-1.025\ 86\times10^{-4}\times\theta^3-1.73238\times\\10^{-2}\times\theta^2-0.977607\times\theta-18.3420.$$

The invention according to claim 3 provides the SAW device, characterized in that, when an electrode finger width of electrode fingers constituting the IDT/(electrode finger width+space between electrode fingers) is defined as a line metalization ratio mr, a relationship between the cut angle θ and a product H/λ×mr of the electrode film thickness and the line metalization ratio satisfies −8.04489×10$^{-5}$×θ$^3$−1.40981×10$^{-2}$×θ$^2$−0.825038×θ−16.0737<H/λ×mr<−6.15517×10$^{-5}$×θ$^3$−1.03943×10$^{-2}$×θ$^2$−0.586564×θ−11.0052.

The invention according to claim 4 provides a SAW device comprising a piezoelectric substrate and an IDT that is formed on the piezoelectric substrate and is made from Al or alloy including Al as a main component, an excited wave being utilized as an SH wave, characterized in that the piezoelectric substrate is a rotation Y cut substrate made from a quartz flat substrate, where a cut angle θ of said piezoelectric substrate is a rotation angle of a crystal Z-axis when the piezoelectric substrate is rotated around a crystal X-axis, a direction in which the piezoelectric substrate is rotated from a positive Z-axis side to a positive Y-axis side is a direction in which said cut angle θ minus, and the cut angle θ is set in a range of −61.4°<θ<−51.1°, and a propagation direction of a SAW is set to (90°±5°) to a crystal X-axis, and when a wavelength of the SAW to be excited is represented as λ, an electrode film thickness H/λ standardized by a wavelength of the IDT is set to satisfy 0.05<H/λ<0.10.

The invention according to claim 5 provides the SAW device, characterized in that a relationship between the cut angle θ and the electrode film thickness H/λ satisfies $$-1.44605\times10^{-4}\times\theta^3-2.50690\times10^{-2}\times\theta^2-1.45086\times\theta-\\27.9464<H/\lambda<-9.875\ 91\times10^{-5}\times\theta^3-1.70304\times\\10^{-2}\times\theta^2-0.981173\times\theta-8.7946.$$

The invention according to claim 6 provides the SAW device, characterized in that, when an electrode finger width of electrode fingers constituting the IDT/(electrode finger width+space between electrode fingers) is defined as a line metalization ratio mr, a relationship between the cut angle θ and a product H/λ×mr of the electrode film thickness and the line metalization ratio satisfies $$-8.67632\times10^{-5}\times\theta^3-1.50414\times10^{-2}\times\theta^2-0.870514\times\theta-\\16.7678<H/\lambda\times mr<-5.92554\times10^{-5}\times\theta^3-1.02183\times\\10^{-2}\times\theta^2-0.588704\times\theta-11.2768.$$

The inventions according to claims 7 to 14 provides the SAW device, characterized in that the SAW device is any one of a one-port SAW resonator, a two-port SAW resonator, a lateral coupling type multi-mode filter, a vertical coupling type multi-mode filter, a ladder type SAW filter, a transversal SAW filter where an IDT propagating a SAW in both directions or in one direction is disposed, or a SAW sensor.

The invention according to claim 15 provides the SAW device, characterized in that the SAW device has grating reflectors on both sides of the IDT.

The invention according to claim 16 provides a module device or an oscillation circuit using the SAW device according to any one of claims 1 to 15.

EFFECT OF THE INVENTION

The SAW device according to claim 1 or 4 of the present invention has a configuration that a rotation Y cut quartz substrate whose cut angle θ is in a range of −64.0°<θ<−49.3°, preferably −61.4°<θ<−51.1° is used, an SH wave excited such that a propagation direction of a SAW is (90°±5°) to a crystal X-axis is used, an electrode material for the IDT and for the grating reflector is Al or alloy mainly containing Al, and the electrode film thickness H/λ standardized by a wavelength is set to satisfy 0.04<H/λ<0.12, preferably 0.05<H/λ<0.10. Since the present invention is configured to concentrate waves which originally submerge in a substrate to advance on a substrate surface to allow the grating reflector or the like to utilize reflection of a SAW efficiently, a SAW device, which is reduced in size, has a high Q value, and is excellent in frequency stability as compared with an ST cut quartz SAW device, can be provided.

By satisfying the condition of the electrode film thickness H/λ and the cut angle θ described in claim 2 or 5, a turnover temperature Tp (° C.) can be set in a practical temperature range.

By satisfying the condition of the product H/λ×mr of the electrode film thickness and the line metalization ratio and the cut angle θ described in claim 3 or 6, a turnover temperature Tp (° C.) can be set in a practical temperature range.

By using the SAW device of the various systems described in any one of claims 7 to 14, a SAW device, which is reduced in size, has a high Q value, and is excellent in frequency stability can be provided.

Since the SAW device described in claim 15 can confine energy of a SAW in an IDT sufficiently by disposing grating reflectors on both sides of the IDT, a downsized SAW device having a high Q value can be provided.

Since the module device or the oscillation circuit described in claim 16 uses the SAW device according to the present invention, a downsized and high performance module device or an oscillation circuit can be provided.

BEST MODE FOR CARRYING OUT THE INVENTION

The present invention will be explained below in detail based on embodiments shown in the drawings. FIG. 1(a) is a plan view of a SAW resonator according to the present invention, where an IDT 2 having positive electrode fingers and negative electrode fingers mutually inserted and grating reflectors 3a and 3b for reflecting a SAW positioned on both sides of the IDT 2 are arranged on a piezoelectric substrate 1. Input/output pads 4a and 4b of the IDT 2 and input/output terminals of a package 6 are electrically connected to each other by metal wires 5a and 5b and an opening portion of the package 6 is sealed by a lid air-tightly. As shown in FIG. 14, the piezoelectric substrate 1 is a quartz flat plate where a cut angle θ of a rotation Y cut quartz substrate is set near a position rotated from a crystal Z-axis in a counterclockwise direction by an angle of −50°, and a propagation direction of a SAW is set to a approximately perpendicular direction (90°±5°) to a crystal X-axis, and the SAW to be excited is an SH wave. Electrode material for the IDT 2 and the grating reflectors 3a and 3b is Al or alloy including Al as a main component. FIG. 1(b) shows a section of the IDT 2, and when a wavelength of a SAW excited on the IDT 2 is represented as λ in the embodiment, an electrode film thickness is represented as a value H/λ standardized by the wavelength, and when an electrode finger width L of the electrode fingers constituting the IDT 2/(electrode finger width L+space S between electrode fingers) is defined as a line metalization ratio mr, mr=0.60 is satisfied.

In the present invention, by setting the electrode film thickness H/λ to be larger than a conventional one in view of the defect in the conventional technique, a SAW are concentrated on a piezoelectric substrate surface, efficient utilization of reflection of a SAW by the grating reflectors is allowed, and SAW energy is confined in the IDT even in a reduced number of IDT pairs or grating reflectors so that a device size is reduced.

Generally, in an optimal design for a SAW resonator, it is important that a frequency-temperature characteristic is excellent, Q is high, and a capacitance ratio γ is small, namely, figure of merit (Q/γ) is large. Various characteristics of the SAW resonator according to the present invention are examined here. FIG. 2 depicts various characteristics of a resonator obtained when −51° rotation Y cut 90° X propagation quartz substrate ((0°, 39°, 90°) in Euler angle expression) is used as the piezoelectric substrate 1, a resonance frequency is set to 315 MHz, the electrode film thickness H/λ is set to 0.06, the number of pairs of the IDT 2 is 100, and the numbers of the grating reflectors 3a and 3b are each 100 in the SAW resonator shown in FIG. 1. The Q value, the figure of merit, and the secondary temperature coefficient based upon an actual trial manufacture result are shown in FIG. 2(a), and the frequency-temperature characteristic based thereupon is shown in FIG. 2(b). For comparison, various characteristics of an ST cut quartz SAW resonator including a piezoelectric substrate having the same size as that of the SAW resonator according to the present invention is also shown as those in a conventional product.

With reference to FIG. 2, when the SAW resonator according to the present invention and the conventional ST cut quartz SAW resonator are compared with each other, such large values that the Q value of the former is 1.8 times or more of the latter and the figure of merit in the former is about twice of the latter are obtained. Regarding the frequency-temperature characteristic, a very excellent effect can be confirmed in the SAW resonator according to the present invention that about +25° C. of the turnover temperature Tp can be obtained, and the frequency fluctuation amount due to a temperature is reduced to about 0.6 times of the conventional technique.

The SAW resonator according to the present invention can reduce the size of the piezoelectric substrate while maintaining a Q value better than that in the ST cut quartz SAW resonator. This is because an amount of increase of a reflection amount of SAW at an IDT or a grating reflector to increase of the electrode film thickness H/λ of the SAW resonator according to the present invention is considerably larger than that in the ST cut quartz SAW resonator. That is, the SAW resonator according to the present invention can realize a high Q value in the number of pairs of IDTs or grating reflectors less than that in the ST cut quartz SAW resonator by making the electrode film thickness H/λ large.

FIG. 3 shows a relationship between the electrode film thickness H/λ and the Q value in the SAW resonator according to the present invention, where a resonator design condition is equal to the one described above. It is understood from FIG. 3 that a value exceeding the Q value (=15000) of the ST cut quartz SAW resonator can be obtained in a range of 0.04<H/λ<0.12. Furthermore, a high Q value exceeding 20000 can be obtained by setting a range of 0.05<H/λ<0.10.

In a comparison of the Q values of the multi-pair IDT type SAW resonator shown in Japanese Examined Patent Publication No. 01-034411 and the SAW resonator according to the present invention, the Q value obtained in the patent application is a value when the resonant frequency is 207.561 (MHz), and the Q value is about 15000 when the resonant frequency is converted to 315 (MHz) that is the resonant frequency applied in the embodiment, where the Q value is approximately equivalent to that in the ST cut quartz SAW resonator. In a comparison of sizes of the resonators, the multi-pair IDT type SAW resonator described in the patent application requires 800±200 IDT pairs, but the present invention only requires a space accommodating 200 IDT pairs for both the IDT and the grating reflectors so that the present invention can be significantly reduced in size. Accordingly, by setting the electrode film thickness in a range of 0.04<H/λ<0.12 and providing grating reflectors to reflect a SAW efficiently, a SAW device, which is more downsized and higher in a Q value than the multi-pair IDT type SAW resonator disclosed in Japanese Examined Patent Publication No. 01-034411, can be realized.

Next, FIG. 4 shows a relationship between the electrode film thickness H/λ and the secondary temperature coefficient in the SAW resonator according to the present invention, where a resonator design condition is equal to the one described above. It is understood from FIG. 4 that a value better than −0.034 (ppm/° C.$^2$) of the secondary temperature coefficient of the ST cut quartz SAW resonator can be obtained in a range of 0.04<H/λ<0.12 where a high Q value can be obtained.

By setting the electrode film thickness H/λ in a range of 0.04<H/λ<0.12 based on the above, a SAW device, which is more downsized and higher in a Q value than the ST cut quartz SAW device and the SAW device disclosed in Japanese Examined Patent Publication No. 01-034411 and is excellent in frequency stability, can be provided.

While only the case that the cut angle θ is set to −51° has been described in the above, even if the cut angle θ is changed in the SAW resonator according to the present invention, a film thickness dependency is not changed so much, so that an excellent Q value and a excellent secondary temperature coefficient can be obtained even at a cut angle shifted from −51° by several degrees by setting the electrode film thickness in a range of 0.04<H/λ<0.12.

The SAW resonator according to the present invention takes a cubic temperature characteristic in a very wide temperature range, but the temperature characteristic can be regarded as a quadratic characteristic in a specific narrow temperature range and a turnover temperature Tp in the temperature range varies depending on the electrode film thickness and the cut angle. Therefore, no matter how excellent the frequency-temperature characteristic is, the frequency stability remarkably degrades when the turnover temperature Tp fluctuates to outside of the usage temperature range. In order to realize excellent frequency stability in a practical usage temperature range (−50° C. to +125° C.), it is necessary to examine not only the secondary temperature coefficient but also the turnover temperature Tp in detail.

FIG. 5(a) shows a relationship between the electrode film thickness H/λ and the turnover temperature Tp, obtained when the cut angle θ is set to −50.5° in the SAW resonator according to the present invention. As apparent from FIG. 5(a), when the electrode film thickness H/λ is made large, the turnover temperature Tp lowers and the relationship between the electrode film thickness H/λ and the turnover temperature Tp is represented by the following approximate expression.

$$Tp(H/\lambda) = -41825 \times (H/\lambda)^2 + 2855.4 \times (H/\lambda) - 26.42 \quad (1)$$

The approximate expression (1) can be applied in the cut angle near −50°, except for its intercept.

FIG. 5(b) shows a relationship between the cut angle θ and the turnover temperature Tp, obtained when the electrode film thickness H/λ is set to 0.06 in the SAW resonator according to the present invention. As apparent from FIG. 5(b), when the absolute value of the cut angle θ is reduced, the turnover temperature Tp lowers, and the relationship between the cut angle θ and the turnover temperature Tp is represented by the following approximate expression.

$$Tp(\theta) = -43.5372 \times \theta - 2197.14 \quad (2)$$

Next, it is understood from the expression (1) and the expression (2) that, when the electrode film thickness H/λ is set to satisfy 0.04<H/λ<0.12, it is sufficient to set the cut angle θ in a range of −59.9°≦θ≦−48.9° for setting the turnover temperature Tp in the practical usage temperature range (−50° C. to +125° C.)

When both the electrode film thickness H/λ and the cut angle θ are taken in consideration, the turnover temperature Tp is represented by the following approximate expression utilizing the expression (1) and the expression (2).

$$Tp(H/\lambda, \theta) = Tp(H/\lambda) + Tp(\theta) = -41825 \times (H/\lambda)^2 + 2855.4 \times (H/\lambda) - 43.5372 \times \theta - 2223.56 \quad (3)$$

In order to set the turnover temperature Tp in the usage temperature range (−50° C. to +125° C.), the electrode film thickness H/λ and the cut angle θ can be set in a range represented by the following expression from the approximate expression (3).

$$0.9613 \leq -18.498 \times (H/\lambda)^2 + 1.2629 \times (H/\lambda) - 0.019255 \times \theta \leq 1.0387 \quad (4)$$

Thus, in the present invention, the rotation Y cut quartz substrate where the cut angle θ is in a range of −59.9°≦θ≦−48.9° is used, the SH wave excited such that a propagation direction of a SAW is a direction approximately perpendicular to the X-axis is used, the electrode material for the IDT and the grating reflector is Al or alloy including Al as a main component, and the electrode film thickness H/λ is set to satisfy 0.04<H/λ<0.12. With this configuration, a SAW device, which is more downsized and higher in a Q value than the ST cut quartz SAW device and is excellent in frequency stability, can be realized.

An optimal condition will be examined here. It is preferable that the electrode film thickness H/λ is set in a range of 0.05<H/λ<0.10 where the Q value of 20000 or more can be obtained as shown in FIG. 3. Furthermore, it is preferable that the cut angle θ is set in a range of −55.7°≦θ≦−50.2° in order to set the turnover temperature Tp in a more practical usage temperature range (0° C. to +70° C.). Furthermore, it is preferable that the cut angle θ and the electrode film thickness H/λ are set in a range defined by the following expression obtained from the approximate expression (3).

$$0.9845 \leq -18.518 \times (H/\lambda)^2 + 1.2643 \times (H/\lambda) - 0.019277 \times \theta \leq 1.0155 \quad (5)$$

In the above explanation, a relational expression between the electrode film thickness H/λ and the cut angle θ where the turnover temperature Tp falls in the practical usage temperature range has been derived from the relationship between the electrode film thickness H/λ and the turnover temperature Tp obtained when the cut angle θ shown in FIG. 5(a) is set to −50.5° and the relationship between the cut angle θ and the turnover temperature Tp obtained when the electrode film thickness H/λ shown in FIG. 5(b) is set to 0.06. More detailed conditions were found by an experiment performed with an expanded range of the cut angle θ, and they will be explained below.

FIG. 6 shows a relationship between the cut angle θ of a quartz substrate and the electrode film thickness H/λ obtained when the turnover temperature Tp (° C.) satisfies Tp=−50, 0, +70, and +125 in the SAW resonator, where approximate expressions for respective Tp characteristics are as follows:

$$Tp = -50(° C.): H/\lambda \approx 1.02586 \times 10^{-4} \times \theta^3 - 1.73238 \times 10^{-2} \times \theta^2 - 0.977607 \times \theta - 18.3420$$

$$Tp = 0(° C.): H/\lambda \approx -9.87591 \times 10^{-5} \times \theta^3 - 1.70304 \times 10^{-2} \times \theta^2 - 0.981173 \times \theta - 18.7946$$

$$Tp = +70(° C.): H/\lambda \approx 1.44605 \times 10^{-4} \times \theta^3 - 2.50690 \times 10^{-2} \times \theta^2 - 1.45086 \times \theta - 27.9464$$

$$Tp = +125(° C.): H/\lambda \approx -1.34082 \times 10^{-4} \times \theta^3 - 2.34969 \times 10^{-2} \times \theta^2 - 1.37506 \times \theta - 26.7895$$

It is understood from FIG. 6 that the cut angle θ and the electrode film thickness H/λ can be set to satisfy a region surrounded by curves of Tp=−50° C. and Tp=+125° C., namely, $-1.34082 \times 10^{-4} \times \theta^3 - 2.34969 \times 10^{-2} \times \theta^2 - 1.37506 \times \theta - 26.7895 < H/\lambda < -1.025 \ 86 \times 10^{-4} \times \theta^3 - 1.73238 \times 10^{-2} \times \theta^2 - 0.977607 \times \theta - 18.3420$, in order to set the turnover temperature Tp (° C.) to satisfy −50≦Tp≦+125 which is a practical range. It is necessary to set the range of the electrode film thickness H/λ at this time to satisfy 0.04<H/λ<0.12 which allows a characteristic better than that of the conventional ST cut quartz device and set the range of the cut angle θ to satisfy −64.0<θ<−49.3 that corresponds to a range from a point A to a point B shown in FIG. 6.

Further, in an examination about the more optimal condition, it is preferable that the turnover temperature Tp (° C.) is set to satisfy 0≦Tp≦+70 that corresponds to a further practical usage temperature range. The cut angle θ and the electrode film thickness H/λ can be set to satisfy a region surrounded by curves of Tp=0° C. and Tp=+70° C. shown in FIG. 6, namely, $-1.44605 \times 10^{-4} \times \theta^3 - 2.50690 \times 10^{-2} \times \theta^2 - 1.45086 \times \theta - 27.9464 < H/\lambda < -9.875 \ 91 \times 10^{-5} \times \theta^3 - 1.70304 \times 10^{-2} \times \theta^2 - 0.981173 \times \theta - 18.7946$, in order to set Tp (° C.) in the range described above. It is also preferable that the electrode film thickness H/λ is set to satisfy a range of 0.05<H/λ<0.10 where the Q value of 20000 or more can be obtained. Furthermore, it is necessary to set the cut angle θ to satisfy −61.4<θ<−51.1 that corresponds to a range from a point C to a point D shown in FIG. 6(a) in order to set the electrode film thickness in the range described above and set the turnover temperature Tp (° C.) to a range of 0≦Tp≦+70.

As the result of the detailed examination explained above, it has been found that an excellent temperature characteristic where the Q value is larger than that in the ST cut quartz SAW device can be obtained, and the turnover temperature Tp can be set in a practical usage temperature range by using a rotation Y cut quartz substrate where the cut angle θ satisfies −64.0°<θ<−49.3°, preferably −61.4°<θ<−51.1°, using an SH wave excited such that a propagation direction of a SAW is a direction approximately perpendicular to the X-axis, forming an electrode material for the IDT or the grating reflector from Al or alloy mainly including Al, and setting the electrode film thickness H/λ to satisfy 0.04<H/λ<0.12, preferably 0.05<H/λ<0.10.

While the example where the Line metalization ratio mr of the IDT is fixed at 0.60 has been explained above, an example where the Tp characteristic is obtained when the line metalization ratio is included in a variable is examined below.

FIG. 7 shows a relationship between the product H/λ×mr of the electrode film thickness and the line metalization ratio and the turnover temperature Tp. A vertical axis indicates the turnover temperature Tp (° C.), while a horizontal axis indicates the product H/λ×mr of the electrode film thickness and the line metalization ratio. At this time, the cut angle θ of the quartz substrate is set to −51.5°. As shown in FIG. 7, it is understood that the turnover temperature Tp lowers according to increase of the value of the product H/λ×mr of the electrode film thickness and the line metalization ratio.

Next, FIG. 8 shows a relationship between the cut angle of the quartz substrate and the product H/λ×mr of the electrode film thickness and the line metalization ratio obtained when the turnover temperature Tp (° C.) is −50, 0, +70, and +125. Approximate expressions for respective Tp characteristics are as follows:

$$Tp=-50(° C.): H/\lambda \times mr \approx -6.15517 \times 10^{-5} \times \theta^3 - 1.03943 \times 10^{-2} \times \theta^2 - 0.586564 \times \theta - 11.0052$$

$$Tp=0(° C.): H/\lambda \times mr \approx -5.92554 \times 10^{-5} \times \theta^3 - 1.02183 \times 10^{-2} \times \theta^2 - 0.588704 \times \theta - 11.2768$$

$$Tp=+70(° C.): H/\lambda \times mr \approx -8.67632 \times 10^{-5} \times \theta^3 - 1.50414 \times 10^{-2} \times \theta^2 - 0.870514 \times \theta - 16.7678$$

$$Tp=+125(° C.): H/\lambda \times mr \approx -8.04489 \times 10^{-5} \times \theta^3 - 1.40981 \times 10^{-2} \times \theta^2 - 0.825038 \times \theta - 16.0737$$

It is understood from FIG. 8 that the cut angle θ and the product H/λ×mr of the electrode film thickness and the line metalization ratio can be set to satisfy a region surrounded by curves of Tp=−50° C. and Tp=+125° C., namely, $-8.04489 \times 10^{-5} \times \theta^3 - 1.40981 \times 10^{-2} \times \theta^2 - 0.825038 \times \theta - 16.0737 < H/\lambda \times mr < -6.15517 \times 10^{-5} \times \theta^3 - 1.03943 \times 10^{-2} \times \theta^2 - 0.586564 \times \theta - 11.0052$, in order to set the turnover temperature Tp (° C.) to satisfy −50≦Tp≦+125 that is a practical range. At this time, it is necessary to set the range of the electrode film thickness H/λ to 0.04<H/λ<0.12 where a characteristic better than that in the conventional ST cut quartz device can be obtained, and set the range of the cut angle θ to −64.0<θ<−49.3.

The cut angle θ and the product H/λ×mr of the electrode film thickness and the line metalization ratio can be set to satisfy a region surrounded by curves of Tp=0° C. and Tp=+70° C. shown in FIG. 8, namely, $-8.67632 \times 10^{-5} \times \theta^3 - 1.50414 \times 10^{-2} \times \theta^2 - 0.870514 \times \theta - 16.7678 < H/\lambda \times mr < -5.92554 \times 10^{-5} \times \theta^3 - 1.02183 \times 10^{-2} \times \theta^2 - 0.588704 \times \theta - 11.2768$, in order to set the turnover temperature Tp (° C.) to satisfy 0≦Tp≦+70, which is a more practical usage temperature range. At this time, it is desirable that the electrode film thickness H/λ is set to satisfy 0.05<H/λ<0.10 where the Q value of 20000 or more can be obtained, and it is desirable that the cut angle θ is set to satisfy −61.4<θ<−51.1, in order to set the electrode film thickness to the range described above and set the turnover temperature Tp (° C.) in a range of 0≦Tp≦+70.

While only a one-port SAW resonator such as the one shown in FIG. 1 has been described hitherto, the present invention can be applied to SAW devices other than the one-port SAW resonator. Structures of various SAW devices will be explained below.

FIG. 9 shows a two-port SAW resonator where IDTs 32 and 33 are disposed along a propagation direction of a SAW on a piezoelectric substrate 31, and grating reflectors 34a and 34b are disposed on both sides of the IDTs 32 and 33, where a high Q value can be realized like the one-port SAW resonator.

FIG. 10 shows a dual mode SAW (DMS) filter utilizing acoustic coupling of SAW resonators as one system for a resonator filter, where FIG. 10(a) shows a lateral coupling type DMS filter where SAW resonators 42 are disposed on a piezoelectric substrate 41 in proximity to each other in parallel with a propagation direction, and FIG. 10(b) shows a two-port vertical coupling type DMS filter where SAW resonators including IDTs 52 are disposed on the piezoelectric substrate 51 along a propagation direction of a SAW. The lateral coupling type DMS filter utilizes perpendicular acoustic coupling to the propagation direction and the two-port vertical coupling type DMS filter utilizes horizontal acoustic coupling to the propagation. These DMS filters have a feature that a flat pass band and excellent out-of-band suppressing degree can be obtained. The two-port vertical coupling type DMS filter can be connected with a SAW resonator for highly attenuating the vicinity of a pass band. The present invention can be applied to a multi-mode SAW filter utilizing a high-order mode or a multi-mode SAW filter where acoustic coupling is performed both in a perpendicular direction and in a horizontal direction to a propagation direction.

FIG. 11 shows a ladder-type SAW filter configured by arranging a plurality of one-port SAW resonators 62 on a piezoelectric substrate 61 in a ladder shape configured by series, parallel, and series as another system of the resonator filters. The ladder-type SAW filter can obtain a filter characteristic where an attenuation slope of the vicinity of the pass band is sharper than that in the DMS filter.

FIG. 12 show transversal SAW filters, where FIG. 12(a) shows one of the transversal SAW filters where an input IDT 72 and an output IDT 73 are disposed on a piezoelectric substrate 71 with a predetermined spacing along a propagation direction of a SAW. The IDTs 72 and 73 propagate a SAW in both directions. A shielding electrode 74 can be provided for preventing influence of a direct wave between input and output terminals or sound absorbing materials 75 can be applied on both ends of the piezoelectric substrate 71 for suppressing unnecessary reflected waves from end faces of the substrate. The transversal SAW filter is frequently used as an IF filter because an amplitude characteristic and a phase characteristic thereof can be designed independently from each other and an out-of-band suppressing degree is high.

The transversal SAW filter has a problem that insertion loss of a filter becomes large because a SAW is propagated equally to right and left along a propagation direction. As a method for solving the problem, there is a transversal SAW filter where so-called single phase uni-directional transducers (SPUDT) 82 and 83 where excitation of a SAW is made uni-directional by changing an electrode finger arrangement or an electrode finger width to weight excitation and reflection of a SAW are disposed, as shown in FIG. 12(*b*). Since the excitation of a SAW is made uni-directional, a low loss filter characteristic can be obtained. As other structures, there are so-called reflection bank type transversal SAW filters where a grating reflector is disposed between exciting electrodes of an IDT and the like.

In the various SAW devices described above, it is apparent that an advantage similar to that obtained in the present invention can be obtained by using a quartz flat plate as a piezoelectric substrate where the cut angle θ of the rotation Y cut quartz substrate is set to satisfy a range of −64.0°<θ<−49.3°, preferably −61.4°<θ<−51.1°, in a counterclockwise direction from the crystal Z-axis, and a propagation direction of an surface acoustic wave is set to 90±5° to the crystal X-axis and setting the electrode film thickness H/λ to satisfy a range of 0.04<H/λ<0.12, preferably 0.05<H/λ<0.10.

In the above described SAW device, it is apparent that an advantage similar to that obtained in the present invention can be obtained even when such a protective film as a protective film made from $SiO_2$ or the like, a protective film obtained by anode-oxidizing Al, or the like is formed on an IDT or a grating reflector, or a closely adhesive layer or another metal thin film for improvement in power withstanding is formed on an upper or lower portion of an Al electrode. It goes without saying that the SAW device according to the present invention is applicable to a sensor device or a module device, an oscillation circuit, or the like. Since the capacity ratio γ can be reduced by using the SAW device according to the present invention in a voltage control SAW oscillator (VCSO) or the like, a variable width of a frequency can be taken larger.

The SAW device according to the present invention can have a structure other than the structure where the SAW chip and the package are wire-bonded to each other, such as the one shown in FIG. 1, and it can have a flip-chip bonding (FCB) structure where an electrode pad of a SAW chip and a terminal of a package are connected via a metal bump, a CSP (chip size package) structure where a SAW chip is bonded on a wiring substrate in a flip-chip manner and surroundings of the SAW chip is resin-sealed, a WLCSP (wafer level chip size package) structure where a package or a wiring substrate is made unnecessary by forming a metal layer or a resin layer on a SAW chip, or the like. An AQP (all quartz package) structure where stacking and sealing are performed in a state that a quartz device is sandwiched by quartzes or glass substrates can be adopted. Since the AQP structure is a structure where sandwiching is simply performed utilizing quartzes or glass substrates, no package is required, thinning can be performed, and out gas due to adhesive can be reduced by adopting low melting point glass sealing or direct bonding, so that an advantage such as an excellent aging characteristic can be achieved.

BRIEF DESCRIPTION OF THE DRAWINGS

FIG. 1 are diagrams for explaining a SAW resonator according to the present invention, where FIG. 1(*a*) is a plan view, and FIG. 1(*b*) is a sectional view of an IDT.

FIG. 2 show comparisons between the SAW resonator according to the present invention and a conventional product, where FIG. 2(*a*) is a diagram showing a comparison regarding a Q value, a figure of merit, and a secondary temperature coefficient, and FIG. 2(*b*) is a diagram showing a comparison regarding a frequency-temperature characteristic.

FIG. 3 is a diagram showing a relationship between an electrode film thickness H/λ and a Q value in the SAW resonator according to the present invention.

FIG. 4 is a diagram showing a relationship between the electrode film thickness H/λ and a secondary temperature coefficient in the SAW resonator according to the present invention.

FIG. 5(*a*) is a diagram showing a relationship between the electrode film thickness H/λ and a turnover temperature Tp in the SAW resonator according to the present invention, and FIG. 5(*b*) is a diagram showing a relationship between a cut angle θ and the turnover temperature Tp therein.

FIG. 6 is a diagram showing a relationship between the cut angle θ and the electrode film thickness H/λ obtained when the turnover temperature Tp (° C.) satisfies Tp=−50, 0, +70, and +125 in the SAW resonator according to the present invention.

FIG. 7 is a diagram showing a relationship between a product H/λ×mr of the electrode film thickness and a line metalization ratio and the turnover temperature Tp in the SAW resonator according to the present invention.

FIG. 8 is a diagram showing a relationship between the cut angle θ and the product H/λ×mr of the electrode film thickness and the line metalization ratio, when the turnover temperature Tp (° C.) in the SAW resonator according to the present invention satisfies Tp=−50, 0, +70, and +125.

FIG. 9 is a diagram for explaining a two-port SAW resonator according to the present invention.

FIG. 10 are diagrams for explaining DMS filters according to the present invention, where FIG. 10(*a*) is a diagram showing a lateral coupling type DMS filter, and FIG. 10(*b*) is a diagram showing a vertical coupling type DMS filter.

FIG. 11 is a diagram for explaining a ladder type SAW filter according to the present invention.

FIG. 12 are diagrams for explaining transversal SAW filters according to the present invention, where FIG. 12(*a*) is a diagram showing a transversal SAW filter where IDTs exciting a SAW in both directions are disposed, and FIG. 12(*b*) is a diagram showing a transversal SAW filter where IDTs exciting a SAW in one direction are disposed.

FIG. 13 is a diagram for explaining a conventional ST cut quartz SAW resonator.

FIGS. 14(*a*) and 14(*b*) are diagrams for explaining a −50° rotation Y cut 90° X propagation quartz substrate.

FIG. 15 is a diagram for explaining a conventional multi-pair IDT type SAW resonator.

EXPLANATION OF THE CODES

1 Piezoelectric substrate
2 IDT
3*a*, 3*b* Grating reflector
4*a*, 4*b* Input/output pad
5*a*, 5*b* Metal wire
6 Package
31 Piezoelectric substrate
32, 33 IDT
34*a*, 34*b* Grating reflector
41 Piezoelectric substrate
42 SAW resonator
51 Piezoelectric substrate
52 IDT
61 Piezoelectric substrate
62 One-port SAW resonator 71 Piezoelectric substrate
72 Input IDT
73 Output IDT
74 Shielding electrode
75 Sound absorbing material
82, 83 Single phase uni-directional transducer

The invention claimed is:

1. A surface acoustic wave device comprising a piezoelectric substrate and an IDT that is formed on said piezoelectric substrate and is made from Al or alloy including Al as a main component, an excited wave being an SH wave, wherein
said piezoelectric substrate is a rotation Y cut substrate made from a quartz flat substrate,
where a cut angle θ of said piezoelectric substrate is a rotation angle of a crystal Z-axis when piezoelectric substrate is rotated around a crystal X-axis,
a direction in which the piezoelectric substrate is rotated from a positive Z-axis side to a positive Y-axis side is a direction in which said cut angle θ is minus, and
the cut angle θ is set in a range of $-64.0° < \theta < -49.3°$, and a propagation direction of a SAW is set to $(90°\pm5°)$ to a crystal X-axis, and
when a wavelength of the SAW to be excited is represented as λ, an electrode film thickness H/λ standardized by a wavelength of said IDT is set to satisfy $0.04 < H/\lambda < 0.12$.

2. The surface acoustic wave device according to claim 1, wherein a relationship between the cut angle θ and the electrode film thickness H/λ satisfies $-1.34082 \times 10^{-4} \times \theta^3 - 2.34969 \times 10^{-2} \times \theta^2 - 1.37506 \times \theta - 26.7895 < H/\lambda < -1.02586 \times 10^{-4} \times \theta^3 - 1.73238 \times 10^{-2} \times \theta^2 - 0.977607 \times \theta - 18.3420$.

3. The surface acoustic wave device according to claim 1, wherein, when an electrode finger width of electrode fingers constituting said IDT/(electrode finger width+space between electrode fingers) is defined as a line metalization ratio mr, a relationship between the cut angle θ and a product H/λ×mr of the electrode film thickness and the line metalization ratio satisfies $-8.04489 \times 10^{-5} \times \theta^3 - 1.40981 \times 10^{-2} \times \theta^2 - 0.825038 \times \theta - 16.0737 < H/\lambda \times mr < -6.15517 \times 10^{-5} \times \theta^3 - 1.03943 \times 10^{-2} \theta^2 - 0.586564 \times \theta - 11.0052$.

4. A surface acoustic wave device comprising a piezoelectric substrate and an IDT that is formed on said piezoelectric substrate and is made from Al or alloy including Al as a main component, an excited wave being utilized as an SH wave, wherein
said piezoelectric substrate is a rotation Y cut substrate made from a quartz flat substrate,
where a cut angle θ of said piezoelectric substrate is a rotation angle of a crystal Z-axis when the piezoelectric substrate is rotated around a crystal X-axis,
a direction in which the piezoelectric substrate is rotated from a positive Z-axis side to a positive Y-axis side is a direction in which said cut angle δ is minus, and
the cut angle θ is set in a range of $-61.4° < \theta < -51.1°$, and a propagation direction of a SAW is set to $(90°\pm5°)$ to a crystal X-axis, and
when a wavelength of the SAW to be excited is represented as λ, an electrode film thickness H/λ standardized by a wavelength of the IDT is set to satisfy $0.05 < H/\lambda < 0.10$.

5. The surface acoustic wave device according to claim 4, wherein a relationship between the cut angle θ and the electrode film thickness H/λ satisfies $-1.44605 \times 10^{-4} \times \theta^3 - 2.50690 \times 10^{-2} \times \theta^2 - 1.45086 \times \theta - 27.9464 < H/\lambda < -9.87591 \times 10^{-5} \times \theta^3 - 1.70304 \times 10^{-2} \times \theta^2 - 0.981173 \times \theta - 18.7946$.

6. The surface acoustic wave device according to claim 4, wherein when an electrode finger width of electrode fingers constituting said IDT/(electrode finger width+space between electrode fingers) is defined as a line metalization ratio mr, a relationship between the cut angle θ and a product K/λ×mr of the electrode film thickness and the line metalization ratio satisfies $-8.67632 \times 10^{-5} \times \theta^3 - 1.50414 \times 10^{-2} \times \theta^2 - 0.870514 \times \theta - 16.7678 < H/\lambda \times mr < -5.92554 \times 10^{-5} \times \theta^3 - 1.02183 \times 10^{-2} \times \theta^2 - 0.588704 \times \theta - 11.2768$.

7. The surface acoustic wave device according to any one of claims 1 to 6, wherein
said surface acoustic wave device is a one-port surface acoustic wave resonator where at least one IDT is disposed on said piezoelectric substrate.

8. The surface acoustic wave device according to any one of claims 1 to 6, wherein
said surface acoustic wave device is a two-port surface acoustic wave resonator where at least two IDTs are disposed along a propagation direction of a surface acoustic wave on said piezoelectric substrate.

9. The surface acoustic wave device according to any one of claims 1 to 6, wherein
said surface acoustic wave device is a lateral coupling type multi-mode filter where a plurality of surface acoustic wave resonators are disposed in proximity to each other in parallel with a propagation direction of a surface acoustic wave on said piezoelectric substrate.

10. The surface acoustic wave device according to any one of claims 1 to 6, wherein
said surface acoustic wave device is a vertical coupling type multi-mode filter where two-port surface acoustic wave resonators comprising a plurality of IDTs are disposed along a propagation direction of a surface acoustic wave on said piezoelectric substrate.

11. The surface acoustic wave device according to any one of claims 1 to 6, wherein
said surface acoustic wave device is a ladder type surface acoustic wave filter where a plurality of surface acoustic wave resonators are connected on said piezoelectric substrate in a ladder shape.

12. The surface acoustic wave device according to any one of claims 1 to 6, wherein
said surface acoustic wave device is a transversal SAW filter where a plurality of IDTs propagating a surface acoustic wave bidirectionally are disposed on said piezoelectric substrate at predetermined intervals.

13. The surface acoustic wave device according to any one of claims 1 to 6, wherein
said surface acoustic wave device is a transversal SAW filter where at least one IDT propagating a surface acoustic wave in one direction is disposed on said piezoelectric substrate.

14. The surface acoustic wave device according to any one of claims 1 to 6, wherein
said surface acoustic wave device is a surface acoustic wave sensor.

15. The surface acoustic wave device according to any one of claims 1 to 6, wherein
said surface acoustic wave device has grating reflectors on both sides of an IDT.

16. A module device or an oscillation circuit using the surface acoustic wave device according to any one of claims 1 to 6.

* * * * *